US006828887B2

(12) United States Patent
Kubby et al.

(10) Patent No.: US 6,828,887 B2
(45) Date of Patent: Dec. 7, 2004

(54) BISTABLE MICROELECTROMECHANICAL SYSTEM BASED STRUCTURES, SYSTEMS AND METHODS

(75) Inventors: Joel A. Kubby, Rochester, NY (US); Fuqian Yang, Lexington, KY (US); Jun Ma, Penfield, NY (US); Kristine A. German, Webster, NY (US); Peter M. Gulvin, Webster, NY (US)

(73) Assignee: JPMorgan Chase Bank, Houston, TX (US)

( * ) Notice: Subject to any disclaimer, the term of this patent is extended or adjusted under 35 U.S.C. 154(b) by 0 days.

(21) Appl. No.: 10/063,762

(22) Filed: May 10, 2002

(65) Prior Publication Data

US 2003/0210115 A1 Nov. 13, 2003

(51) Int. Cl.[7] .............................................. H01H 51/22
(52) U.S. Cl. ......................................... 335/78; 200/181
(58) Field of Search ................................ 257/414, 417, 257/421–424, 532; 335/78; 200/181; 310/306–309

(56) References Cited

U.S. PATENT DOCUMENTS

| | | | |
|---|---|---|---|
| 5,909,078 A | * | 6/1999 | Wood et al. ................ 310/307 |
| 6,168,395 B1 | | 1/2001 | Quenzer et al. |
| 6,303,885 B1 | | 10/2001 | Hichwa et al. |

OTHER PUBLICATIONS

Qiu, et al., "A Centrally–Clamped Parallel–Beam Bistable MEMS Mechanism," Massachusetts Instituteof Technology, IEEE MEMS 2001 Conference Proceedings. Redacted (no month).

Qiu, et al., "A Centrally–Clamped Parallel–Beam Bistable MEMS Mechanism," Massachusetts Institute of Technology, IEEE MEMS 2001 Conference Proceedings. (no date).

Saif, "On a Tunable Bistable MEMS–Theory and Experiment", Journal of Microelectromechanical Systems, vol. 9, No. 2, pp. 157–170, Jun. 2000.

Vangbo et al., "A lateral symmetrically bistable buckled beam", J. Micromech. Micreng., 8 (1998), pp. 29–32.

* cited by examiner

*Primary Examiner*—Lincoln Donovan

(57) ABSTRACT

A bistable microelectromechanical system (MEMS) based system comprises a micromachined beam having a first stable state, in which the beam is substantially stress-free and has a specified non-linear shape, and a second stable state. The curved shape may comprises a simple curve or a compound curve. In embodiments, the boundary conditions for the beam are fixed boundary conditions, bearing boundary conditions, spring boundary conditions, or a combination thereof. The system may further comprise an actuator arranged to move the beam between the first and second stable states and a movable element that is moved between a first position and a second position in accordance with the movement of the beam between the first and second stable states. The actuator may comprise one of a thermal actuator, an electrostatic actuator, a piezoelectric actuator and a magnetic actuator. The actuator may further comprise a thermal impact actuator or a zippering electrostatic actuator.

27 Claims, 5 Drawing Sheets

BISTABLE MICROELECTROMECHANICAL SYSTEM BASED STRUCTURES, SYSTEMS AND METHODS

BACKGROUND OF THE INVENTION

1. Field of Invention

This invention relates to microelectromechanical system (MEMS) based structures and microelectromechanical system (MEMS) based systems including at least one bistable structure. This invention also relates to methods for fabricating such structures and systems, as well as methods for actuating microelectromechanical system based systems.

2. Description of Related Art

Bistable beams are known for use in microelectromechanical system (MEMS) based systems. Such bistable beams have applications in, for example, digital data storage and electrical and optical switching.

For example, a tunable micromechanical bistable system is described by M. T. A. Saif in "On a Tunable Bistable MEMS—Theory and Experiment", Journal of Microelectromechanical Systems, Vol. 9, No. 2, pp. 157–170, June 2000. The bistable system consists of a long slender micromechanical beam attached to an actuator. The beam is subjected to a transverse force at the middle and a residual stress developed during fabrication. The actuator generates a compressive force along the axial direction of the beam so that the beam buckles along the transverse direction into one of two equilibrium states.

Another example of a known beam structure is described by Vangbo et al. in "A Lateral Symmetrically Bistable Buckled Beam", J. Micromech. Microeng., 8 (1998), pp. 29–32. As described, a lateral symmetrically bistable beam is snapped into the structure of a microelectromechanical system (MEMS) based device and held in a fixed position by spring forces. The beam structure consists of a released upright beam that has been oxidized to induce tensile stress or has a compressive film deposited thereon.

U.S. Pat. No. 6,168,395 to Quenzer et al. describes a bistable electrostatic actuator with pneumatic or liquid coupling. The bistable actuator has buckled membrane sections that are driven by enclosed electrodes. The membranes operate in counteraction, such that pulling one membrane down pushes the other membrane up. The bistable actuator is particularly designed for a microvalve application and uses curved-shaped electrodes.

U.S. Pat. No. 6,303,885 to Hichwa et al. describes a bistable micro-machined electromechanical switch. The bistable switch includes a switch element that is suspended between portions of a switch body by a plurality of spring arms that are attached at walls of hollow body portions of a center beam. The spring arms and hollow beam walls deform in response to a motive force of an actuator to move between the stable states.

SUMMARY OF THE INVENTION

As described above, either a built-in stress, an applied compressive force, or a hollow beam portion forming an additional spring is needed for known bistable beams. However, the addition of an actuator for the applied compressive force renders the design and fabrication of the system complex. Also, creating a built-in stress in a beam renders fabrication difficult because controlling the built-in stress is difficult. Further, the addition of a hollow beam portion increases the complexity of design and fabrication.

This invention eliminates these and other drawbacks associated with conventional bistable beams.

The systems and methods according to this invention provide a micromachined bistable beam having a first stable state in which the beam is substantially stress-free.

The systems and methods according to this invention separately provide improved flexibility in the design of a bistable system.

The systems and methods according to this invention separately provide reduced complexity in the design of a bistable system.

The systems and methods according to this invention separately provide improved manufacturability of a bistable system.

The systems and methods according to this invention separately provide reduced size and weight of a bistable system.

The systems and methods according to this invention separately provide reduced manufacturing costs for a bistable system.

The systems and methods according to this invention separately provide bistable actuation with improved performance.

The systems and methods according to this invention separately provide bistable actuation with improved robustness and/or reliability.

The systems and methods according to this invention separately provide bistable actuation with improved efficiency.

The systems and methods according to this invention separately provide a bistable beam with increased out-of-plane stiffness.

The systems and methods according to this invention separately provide non-contact and/or steady state non-contact actuation of a bistable beam.

The systems and methods according to this invention separately provide switching using a bistable system.

The systems and methods according to this invention separately provide a waveguide switch with bistable actuation.

The systems and methods according to this invention separately provide attenuation using a bistable system.

The systems and methods according to this invention separately provide improved control of a first position of a bistable beam in its first stable state.

The systems and methods according to this invention separately provide improved control of a second position of a bistable beam in its second stable state.

The systems and methods according to this invention separately provide a bistable system including a stop that contacts a bistable beam when the beam is between first and second stable states and near the second stable state.

In various exemplary embodiments according to the systems and methods of this invention, a bistable microelectromechanical system (MEMS) based system comprises a micromachined beam having a first stable state, in which the beam is substantially stress-free and has a specified non-linear shape, and a second stable state. In various embodiments, the specified non-linear shape comprises a simple curve. In other various embodiments, the specified non-linear shape comprises a compound curve, such as, for example, four substantially identical arcs. In still other embodiments, the specified non-linear shape comprises a series of linear segments.

In various exemplary embodiments, the beam has at least one fixed boundary condition. In other various embodiments, the beam has at least one bearing boundary condition. In other various embodiments, the beam has at least one spring boundary condition. The beam may also have a combination of different boundary conditions.

In various exemplary embodiments, the system further comprises a stop disposed between the first and second stable states of the beam. The stop may be disposed near the second stable stated of the beam so that the beam is biased against the stop when moved from the first stable state.

In various exemplary embodiments according to the systems and methods of this invention, a bistable microelectromechanical system (MEMS) based system comprises: a micromachined beam having a first stable state, in which the beam is substantially stress-free and has a specified non-linear shape, and a second stable state; an actuator arranged to move the beam between the first and second stable states; and a movable element that is moved between a first position and a second position in accordance with the movement of the beam between the first and second stable states. The actuator may comprise one of a thermal actuator, an electrostatic actuator, a piezoelectric actuator and a magnetic actuator. In various exemplary embodiments, the actuator comprises a thermal impact actuator. In various other embodiments, the actuator comprises a zippering electrostatic actuator.

In various exemplary embodiments according to the systems and methods of this invention, a first force is applied in a first direction so that a micromachined beam having a first stable state, in which the beam is substantially stress-free and has a specified non-linear shape, is moved from the first stable state to a second stable state. Applying the first force may comprise applying a force using one of a thermal actuator, an electrostatic actuator, a piezoelectric actuator and a magnetic actuator. In various exemplary embodiments, applying the first force comprises applying a force using a thermal impact actuator. In various other embodiments, applying the first force comprises applying a force using a zippering electrostatic actuator.

In various exemplary embodiments, a second force is applied in a second direction so that the beam is moved from the second stable state to the first stable state. Applying the second force may also comprise applying a force using one of a thermal actuator, an electrostatic actuator, a piezoelectric actuator and a magnetic actuator. Applying the second force may also comprise applying a force using a thermal impact actuator or using a zippering electrostatic actuator.

In various exemplary embodiments according to the systems and methods of this invention, a bistable microelectromechanical system (MEMS) based system is fabricated by lithographically defining a beam having a specified non-linear shape corresponding to a first stable state of the beam. In various exemplary embodiments, the fabrication method further comprises determining a second stable state of the beam by lithographically defining the beam to have a certain geometry. In various embodiments, lithographically defining the beam to have a certain geometry comprises lithographically defining the beam to have at least one of a certain length, a certain width, a certain height and a certain curvature. In various embodiments, the height of the beam is defined to be greater than the width of the beam to reduce potential out-of-plane buckling of the beam.

In various exemplary embodiments, the fabrication method further comprises determining a throw distance of the beam between the first and second stable states by lithographically defining the beam to have a certain geometry. In various embodiments, lithographically defining the beam to have a certain geometry comprises lithographically defining the beam to have at least one of a certain length, a certain width, a certain height and a certain curvature.

In various exemplary embodiments, the fabrication method further comprises determining a force curve of the beam between the first and second stable states by lithographically defining the beam to have a certain geometry. In various embodiments, lithographically defining the beam to have a certain geometry comprises lithographically defining the beam to have at least one of a certain length, a certain width, a certain height and a certain curvature.

In various exemplary embodiments, the fabrication method further comprises forming at least one of a thermal actuator, an electrostatic actuator, a piezoelectric actuator and a magnetic actuator adjacent the beam. In various embodiments, forming at least one of a thermal actuator, an electrostatic actuator, a piezoelectric actuator and a magnetic actuator adjacent the beam comprises forming a thermal impact actuator. In various other embodiments, forming at least one of a thermal actuator, an electrostatic actuator, a piezoelectric actuator and a magnetic actuator adjacent the beam comprises forming a zippering electrostatic actuator.

In various exemplary embodiments, the fabrication method further comprises forming at least one fixed boundary condition of the beam. In various other embodiments, the fabrication method further comprises forming at least one bearing boundary condition of the beam. In various other embodiments, the fabrication method further comprises forming at least one spring boundary condition of the beam. The fabrication method may further comprise forming a combination of different boundary conditions of the beam.

In various exemplary embodiments, the method step of lithographically defining the beam comprises patterning the beam in a device layer of a silicon-on-insulator wafer. The fabrication method may further comprise partially etching an insulator layer between the device layer and a substrate to release the beam with part of the insulator layer remaining to anchor the beam to the substrate.

In various exemplary embodiments according to the systems and methods of this invention, a microelectromechanical system (MEMS) based system comprises an input, an output, a movable element communicating between the input and the output and a micromachined beam having a first stable state, in which the beam is substantially stress-free and has a specified non-linear shape, and a second stable state. In various exemplary embodiments, the system is an optical system having an optical input and an optical output. In other exemplary embodiments, the system is an electrical system having an electrical input and an electrical output. In still other embodiments, the system is a fluidic system having a fluidic input and a fluidic output. In various exemplary embodiments, the system comprises a data storage system. In other exemplary embodiments, the system comprises a switching system.

These and other features and advantages of this invention are described in, or are apparent from, the following detailed description of various exemplary embodiments of the systems and methods according to this invention.

BRIEF DESCRIPTION OF THE DRAWINGS

Various exemplary embodiments of the systems and methods of this invention described in detail below, with reference to the attached drawing figures, in which.

DETAILED DESCRIPTION OF PREFERRED EMBODIMENT

Figure 1:
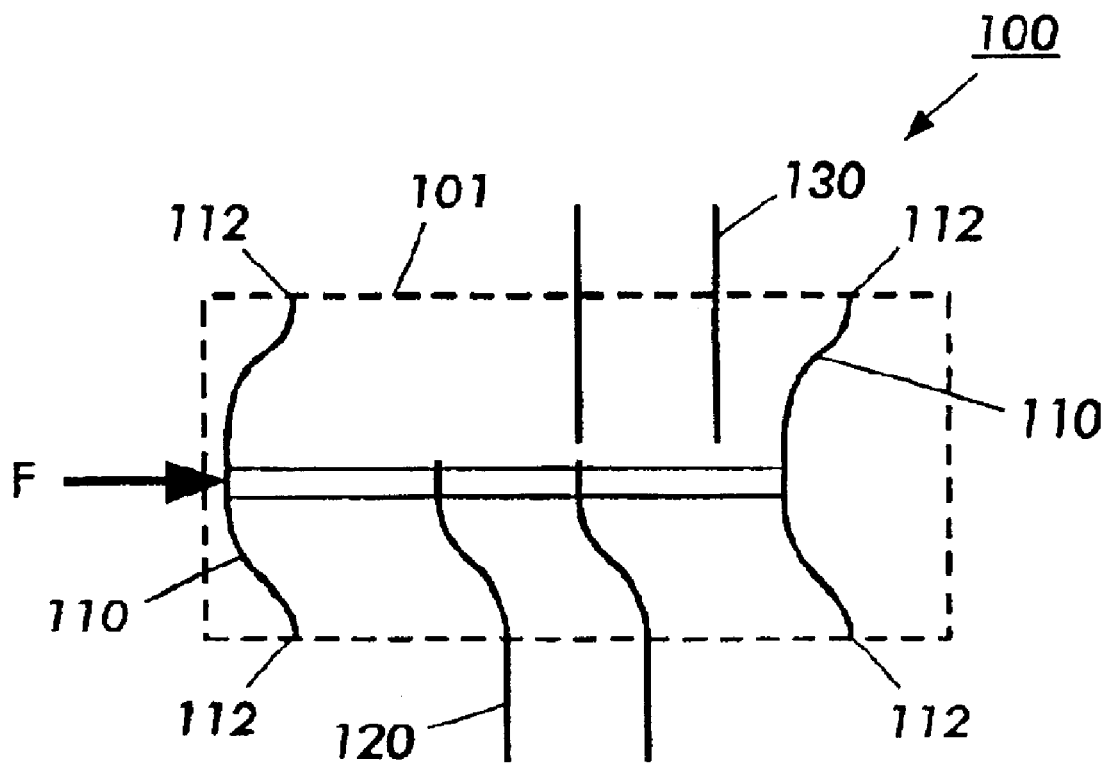
FIG. 1 is a schematic representation of a first exemplary embodiment of a microelectromechanical system (MEMS) based system including a bistable beam according to this invention, shown in a first stable state.

While the invention is described hereafter with reference to an optical switching system, it should be understood that this invention is not strictly limited to such systems. Rather, any microelectromechanical system (MEMS) based system that utilizes bistable states is contemplated by this invention. The description is intended to convey the features of the invention without limiting the invention to the specific embodiments disclosed.

The systems and methods according to this invention provide a bistable microelectromechanical system (MEMS) based system. In various embodiments according to this invention, the bistable microelectromechanical system (MEMS) based system comprises a micromachined beam having a first stable state, in which the beam is substantially stress-free and has a specified non-linear shape, and a second stable state. The bistable microelectromechanical system (MEMS) based system according to this invention provides improved flexibility in design, improved manufacturability, reduced size and weight, reduced manufacturing costs, bistable actuation with improved performance and/or bistable actuation with improved efficiency.

In various exemplary embodiments, the specified non-linear shape comprises a simple curve. In other various embodiments, the specified non-linear shape comprises a compound curve. For example, the compound curve may comprise four substantially identical arcs. In still other embodiments, the specified non-linear shape comprises a series of linear segments. The specified non-linear shape defines the first stable state of the beam.

In various exemplary embodiments, the bistable microelectromechanical system (MEMS) based system is fabricated by lithographically defining the beam to have the specified non-linear shape corresponding to the first stable state of the beam. In various exemplary embodiments, a second stable state of the beam is determined by lithographically defining the beam to have a certain geometry, such as, for example, length, width and/or curvature. Further, other features of the beam may be determined by lithographically defining the beam to have a certain geometry. Lithography provides an accurate and controllable fabrication process in which stress is not introduced.

In various exemplary embodiments, the method step of lithographically defining the beam comprises patterning the beam in a device layer of a silicon-on-insulator wafer. The fabrication method may further comprise partially etching an insulator layer between the device layer and a substrate to release the beam with part of the insulator layer remaining to anchor the beam to the substrate. The device layer is a substantially stress-free layer. Thus, unwanted stress in the beam is avoided.

The systems and methods according to this invention also provide bistable actuation. In various exemplary embodiments, a first force is applied in a first direction so that a micromachined beam having a first stable state, in which the beam is substantially stress-free and has a specified non-linear shape, is moved from the first stable state to a second stable state. In various exemplary embodiments, a second force is applied in a second direction so that the beam is moved from the second stable state to the first stable state.

The beam and/or bistable actuation according to this invention may be used in various applications and may form part of a larger system. For example, a microelectromechanical system (MEMS) based system may comprise an input, an output, a movable element communicating between the input and the output and a micromachined beam having a first stable state, in which the beam is substantially stress-free and has a specified non-linear shape, and a second stable state. Further, the system may be optical, electrical or fluidic. Also, the system may be a data storage system or a switching system.

According to various exemplary embodiments of this invention, micromachining and other microelectromechanical system based manufacturing techniques are used to fabricate a micromachined beam having a first stable state, in which the beam is substantially stress-free and has a specified non-linear shape, and a second stable state. Such manufacturing technologies are relatively advanced compared to other potential technologies, yielding more reliable results and greater flexibility. In various exemplary embodiments, surface micromachining techniques, such as lithography noted above, are used to fabricate a bistable beam.

A schematic representation of a microelectromechanical system (MEMS) based system 100 according to a first exemplary embodiment of this invention is shown in FIG. 1. The system 100 includes a pair of bistable beams 110, shown in a first stable state. Although a pair of bistable beams is shown, it should be understood that a single bistable beam may be used. When two or more bistable beams are employed, the beams work together to improve performance and/or to increase reliability and/or accuracy. The bistable beams 110 are anchored to a substrate 101 using suitable boundary conditions 112, such as a fixed boundary condition, a bearing boundary condition, a spring boundary condition or a combination of different boundary conditions. The bistable beams 110 are fabricated to have a specified non-linear shape and to be substantially stress-free in the first stable state.

A movable member 120, such as a waveguide or an optical fiber, may be arranged to move with the bistable beams 110. As shown in FIG. 1, a stationary member 130, such as a corresponding waveguide or optical fiber, is fixed to the substrate 101.

Figure 2:
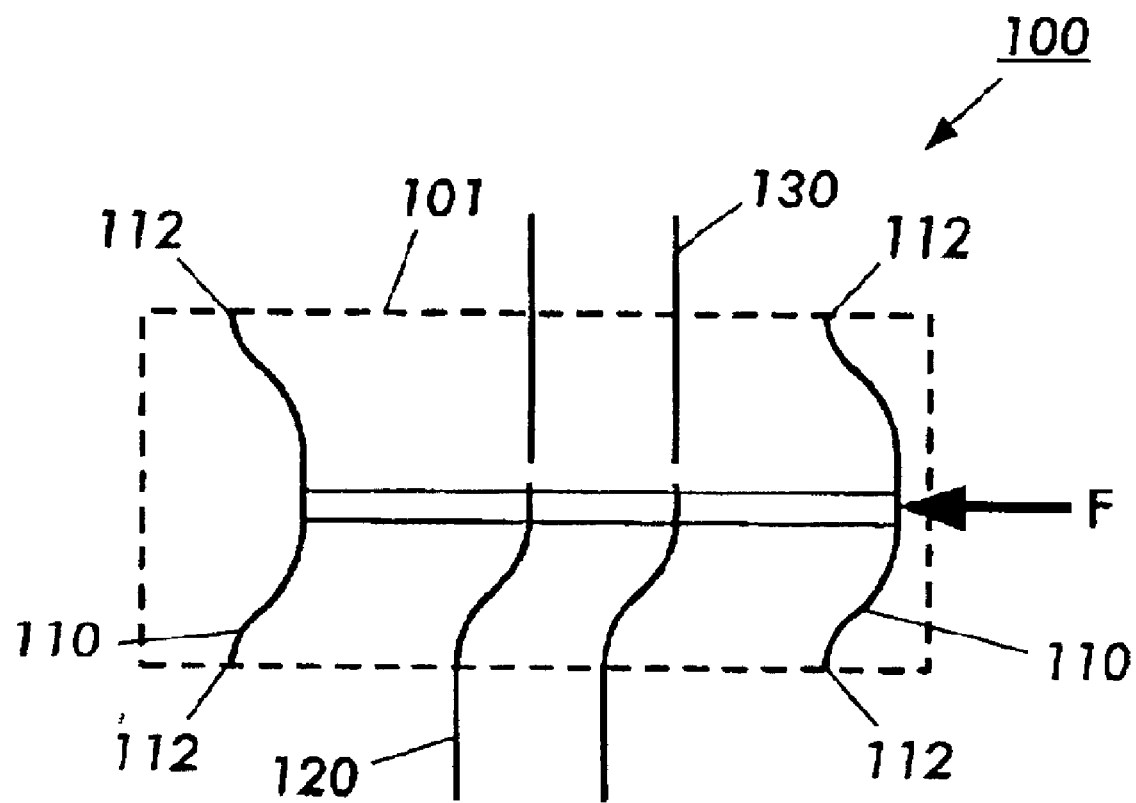
FIG. 2 is a schematic representation of the first exemplary embodiment of FIG. 1, shown in a second stable state.

A schematic representation of the first embodiment is shown in FIG. 2 with the bistable beams 110 in a second stable state. As shown, the movable member 120 is moved with the bistable beams 110 from the first stable state to the second stable state such that the movable member 120 is aligned with, or is in communication with, the stationary member 130. As illustrated in FIGS. 1 and 2, a force F is applied to the bistable beams 110 to cause the bistable beams 110 to move between the first and second stable states.

The bistable beams 110 are schematically represented in FIGS. 1 and 2. It should be understood that the specified non-linear shape of the beams may be any suitable shape, including, but not limited to, a simple curve, a compound curve, a series of linear segments and the like. As such, the specified non-linear shape may be any shape that is capable of defining a first stable state.

Figure 3:
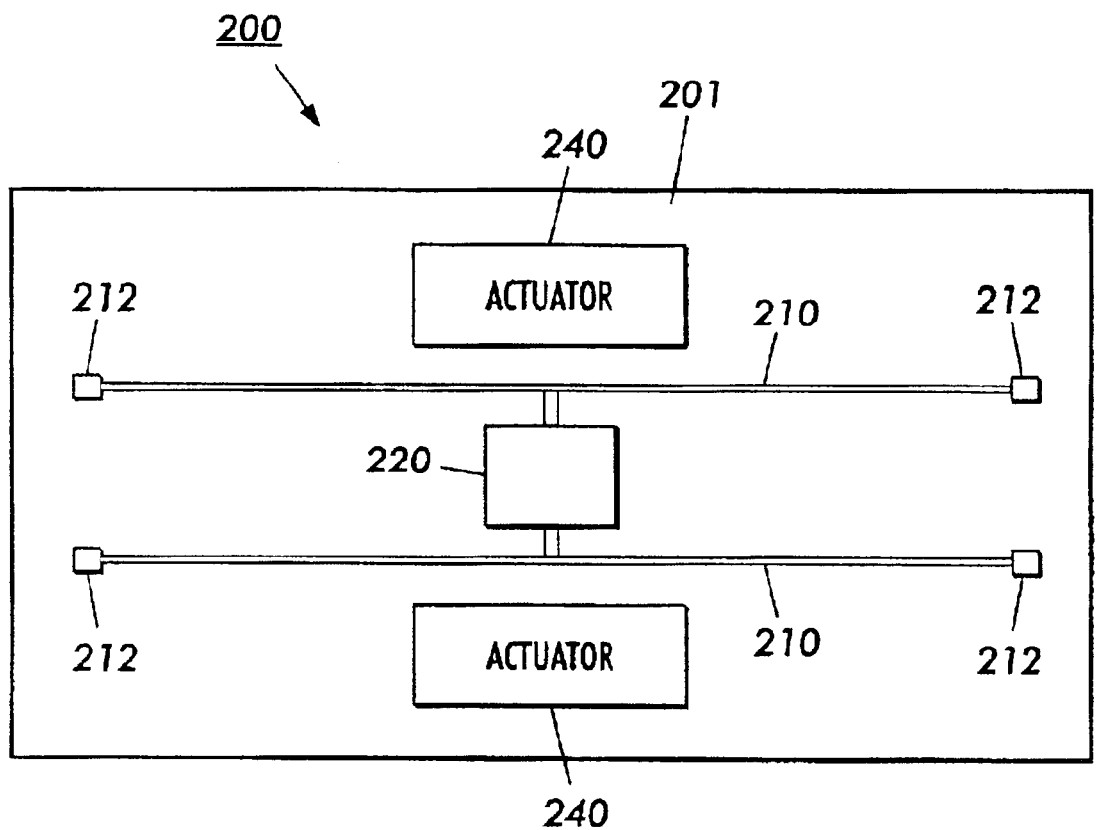
FIG. 3 is a schematic representation of a second exemplary embodiment of a microelectromechanical system (MEMS) based system including a bistable beam according to this invention and an actuator.

A schematic representation of a microelectromechanical system (MEMS) based system 200 according to a second exemplary embodiment of this invention is shown in FIG. 3. The system 200 includes a pair of bistable beams 210, shown in a first stable state, and at least one actuator 240. The bistable beams 210 are anchored to a substrate 201 using suitable boundary conditions 212.

A movable member 220 is arranged to move with the bistable beams 210. The movable member 220 is moved with the bistable beams 210 from the first stable state to a second stable state by the actuators 240 applying a force to the bistable beams 210 that causes the bistable beams 210 to move between the first and second stable states. The force may be applied directly or indirectly, and may be accomplished though contact with the bistable beams 210 or without contacting the bistable beams 210.

The actuators 240 may be any device, either known or hereafter developed, that is capable of applying a force to move a bistable beam between stable states. For example, the actuators 240 may be thermal actuators, electrostatic actuators, piezoelectric actuators, magnetic actuators or any combination thereof. The particular applicator(s) may be selected based on the design considerations for a given application. For example, a thermal impact actuator or a zippering electrostatic actuator may be advantageous for certain applications.

Figure 4:
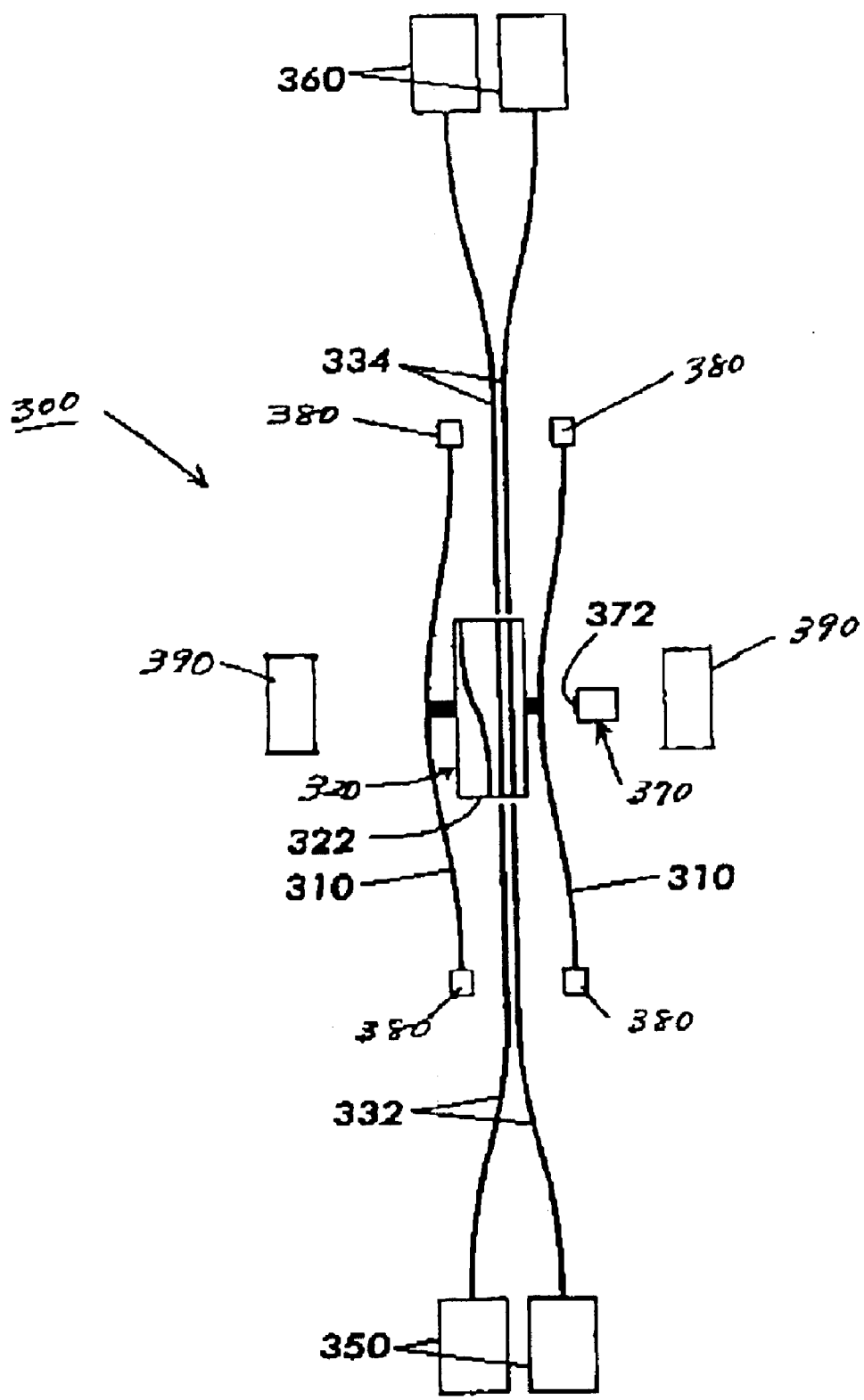
FIG. 4 is a schematic representation of an exemplary embodiment of an optical switching system including a bistable beam according to this invention, shown in a first stable state.

As noted above, the microelectromechanical system (MEMS) based systems according to the invention may be incorporated into a larger or composite system. For example, as schematically shown in FIG. 4, an optical switching system 300 includes a pair of bistable beams 310, shown in a first stable state in which the beams 310 have a specified non-linear shape and are substantially stress-free. The bistable beam 310 are anchored using suitable boundary conditions 380.

The system 300 further comprises input optical fibers 350 and output optical fibers 360 placed in communication with different stationary waveguides 332 and 334, respectively. A movable switching member 320 is situated between the stationary waveguides 332 and 334 and may be moved relative to the stationary waveguides 332 and 334. The movable switching member 320 is arranged to move with the bistable beams 310 and may comprise, for example, an array of waveguides 322 as shown in FIG. 4.

In use, a force F is applied to the bistable beams 310 by an actuator 390 to move the bistable beams 310 from the first stable state, shown in FIG. 4, into a second stable state (not shown). The movable switching member 320 is moved along with the bistable beams 310 so that different waveguides 322 communicate between the stationary waveguides 322 and 334. In this manner, an optical signal input into one of the input optical fibers 350 may be switched between the output optical fibers 360, for example. Further, the waveguides 322 of the movable member 320 maybe arranged so that the optical signal is switched out by moving the movable member 320 with the bistable beams 310 between the first and second stable states. Also, the waveguides 322 of the movable member 320 may be arranged to provide attenuation of the optical signal.

As shown in FIG. 4, the second stable state may be altered by including a stop 370. The stop 370 is positioned so that one of the bistable beams 310 will contact the stop 370 before reaching the natural second stable state. With such a positioning of the stop 370, one of the bistable beams 310 will be biased against the stop 370 in the second stable state. This will help to ensure that the bistable beams 310, and the moveable member 320, are accurately and reliably positioned in the second stable state. As shown in FIG. 4, the stop 370 may include a ridge 372 to reduce stiction between the stop 370 and the portion of the bistable beams 310 in contact therewith.

Figure 5:
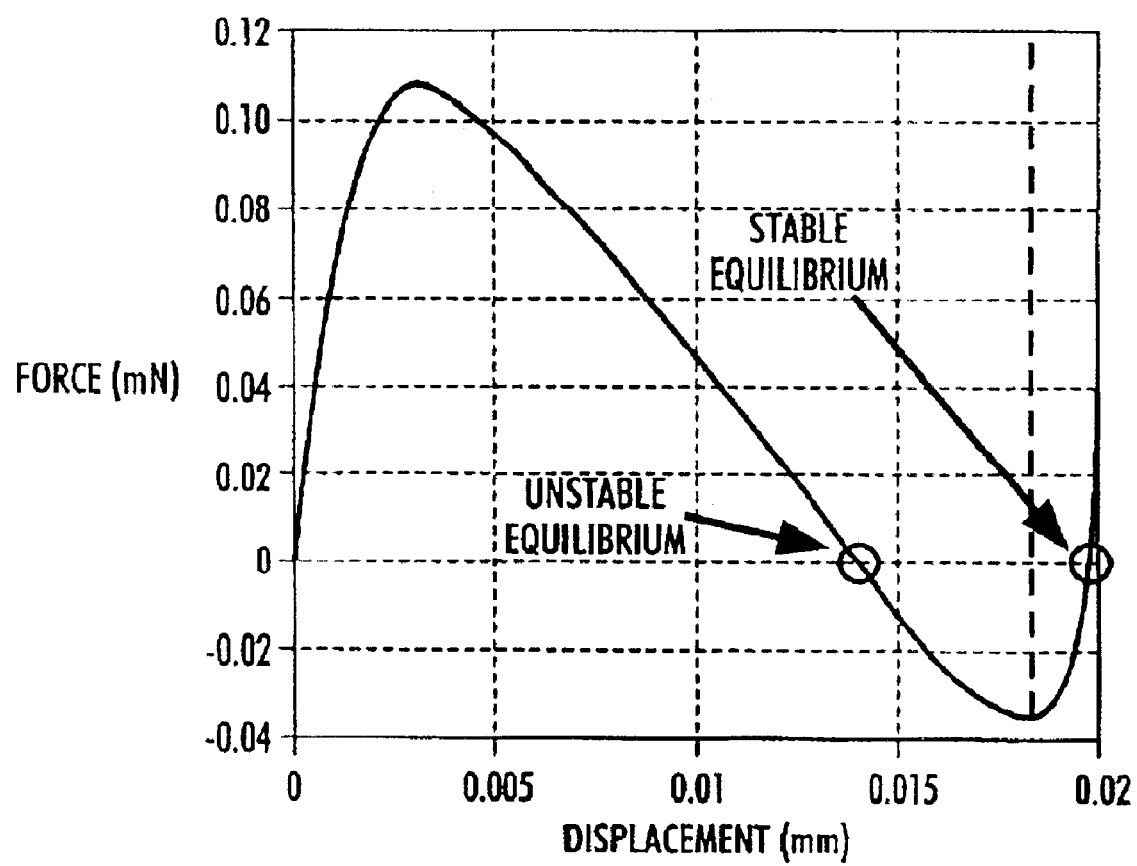
FIG. 5 is an exemplary graphical illustration of a force curve for exemplary embodiment of FIG. 4 showing a stable equilibrium of the beam in a second stable state.

As illustrated in the exemplary graph of FIG. 5, the displacement of the beams shown relative to the force that is applied to move the beams. The non-linear shape and the geometry of the beams will determine the actual curve.

After the beams are moved from the first stable state, the beams move through an unstable equilibrium to a stable equilibrium, the second stable state of the beams. The position of the stop 370 is illustrated as a vertical dashed line in FIG. 5. As shown, the stop is located between the unstable equilibrium and the stable equilibrium corresponding to the natural second stable state, at about 0.0185 mm. Thus, the beams will be stopped before reaching the stable equilibrium corresponding to the natural second stable state. The resilient forces of the beams toward that stable equilibrium will bias the beams against the stop.

A bistable microelectromechanical system (MEMS) based system may be fabricated according to this invention by lithographically defining a beam having a specified non-linear shape corresponding to a first stable state of the beam. Any lithographic technique, either known or hereafter developed, may be used. Lithography allows the features of the beam, such as the shape and geometry, to be produced accurately.

As noted above, the specified non-linear shape of the beam defines the first stable state of the beam. Similarly, the geometry of the beam will define the second stable state of the beam. Thus, according to various exemplary embodiments of this invention, the fabrication method further comprises determining a second stable state of the beam by lithographically defining the beam to have a certain geometry. The certain geometry may comprise one or more of a certain length, a certain width, a certain height and a certain curvature. It should be understood that the height may also be defined by a thickness of a material layer in which the beam is fabricated.

Also, a certain geometry of the beam may be lithographically defined to determine various other features of the beam. For example, the geometry of the beam may be defined to determine a throw distance and/or a force curve of the beam.

In various exemplary embodiments, lithography is also used to form the actuator (s) associated with the bistable beam. Similarly, the boundary conditions of the bistable beam may be formed using lithographic techniques. While other similar manufacturing techniques may be used, it may be advantageous to fabricate the entire system using the same technique, for example, simplifying the process by requiring less independent method steps.

As noted above, the beam may be lithographically defined by patterning the beam in the device layer of a silicon-on-insulator wafer. The insulator layer between the device layer and the substrate may be partially etched to release the beam with part of the insulator layer remaining to anchor the beam to the substrate. The part of the insulator anchoring the beam may be patterned and etched to define the desired boundary condition for the beam.

An exemplary technique that is suitable for fabricating the bistable beam in the device layer is described in copending U.S. patent application Ser. Nos. 09/467,526, 09/468,423, 09/468,141, which are incorporated by reference in their entirety. Another suitable technique is described in copending U.S. patent application Ser. No. 09/718,017, which is incorporated by reference in its entirety.

In general, polysilicon surface micromachining uses planar fabrication process steps common to the integrated circuit (IC) fabrication industry to manufacture microelectromechanical or micromechanical devices. The standard building-block process consists of depositing and photolithographically patterning alternating layers on a substrate. The alternating layers consist of low-stress polycrystalline silicon (also termed polysilicon) and a sacrificial material such as silicon dioxide on a substrate. Vias etched through the sacrificial layers provide anchor points to the substrate and between the polysilicon layers. The polysilicon layers are patterned to form mechanical elements of the micromachined device. The mechanical elements are thus formed layer-by-layer in a series of deposition and patterning process steps. The silicon dioxide layers are then removed by exposure to a selective etchant, such as hydrofluoric acid (HF), which does not attack the polysilicon layers. This releases the mechanical elements formed in the polysilicon layers for movement thereof.

While this invention has been described in conjunction with various exemplary embodiments, it is to be understood that many alternatives, modifications and variations would be apparent to those skilled in the art. Accordingly, Applicants intend to embrace all such alternatives, modifications and variations that follow in the spirit and scope of this invention.

What is claimed is:

1. A bistable microelectromechanical system (MEMS) based system, comprising:
    at least one micromachined beam having a first stable state, in which the at least one beam is substantially stress-free and has a specified non-linear shape, and a second stable state.

2. The system of claim 1, wherein the specified non-linear shape comprises a simple curve.

3. The system of claim 1, wherein the specified non-linear shape comprises a compound curve.

4. The system of claim 3, wherein the compound curve comprises four substantially identical arcs.

5. The system of claim 1, wherein the specified non-linear shape comprises a series of linear segments.

6. The system of claim 1, wherein the at least one beam has at least one fixed boundary condition.

7. The system of claim 1, wherein the at least one beam has at least one bearing boundary condition.

8. The system of claim 1, wherein the at least one beam has at least one spring boundary condition.

9. The system of claim 1, wherein a thickness of the at least one beam is greater than a width of the at least one beam.

10. The system of claim 1, wherein the at l ast one micromachined beam comprises two micromachined beams acting together.

11. The system of claim 1, further comprising:
    an actuator arranged to move the at least one beam between the first and second stable states; and
    a movable element that is moved between a first position and a second position in accordance with the movement of the at least one beam between the first and second stable states.

12. The system of claim 11, wherein the actuator comprises one of a thermal actuator, an electrostatic actuator, a piezoelectric actuator and a magnetic actuator.

13. The system of claim 12, wherein the actuator comprises a thermal impact actuator.

14. The system of claim 12, wherein the actuator comprises a zippering electrostatic actuator.

15. The system of claim 1, further comprising:
    a stop arranged to contact the at least one beam when the at least one beam that moves between the first and second stable states is near the second stable state.

16. A method for actuating a microelectromechanical system (MEMS) based system using the bistable microelectromechanical system (MEMS) based system of claim 1, comprising:
    applying a first force in a first direction to the at least one beam, the first force moving the at least one beam from the first stable state toward the second stable state.

17. The method of claim 16, further comprising stopping the at least one beam before the at least one beam reaches the second stable state.

18. The method of claim 16, wherein applying the first force comprises applying a force using one of a thermal actuator, an electrostatic actuator, a piezoelectric actuator and a magnetic actuator.

19. The method of claim 18, wherein applying the first force comprises applying a force using a thermal impact actuator.

20. The method of claim 18, wherein applying the first force comprises applying a force using a zippering electrostatic actuator.

21. The method of claim 16, further comprising applying a second force in a second direction so that the at least one beam is returned to the first stable state.

22. The method of claim 21, wherein at least one of applying the first force and applying the second force comprises applying a force using one of a thermal actuator, an electrostatic actuator, a piezoelectric actuator and a magnetic actuator.

23. The method of claim 22, wherein at least one of applying the first force and applying the second force comprises applying a force using a thermal impact actuator.

24. The method of claim 22, wherein at least one of applying the first force and applying the second force comprises applying a force using a zippering electrostatic actuator.

25. A microelectromechanical system (MEMS) based system, comprising:
    an input;
    an output;
    a movable element disposed between the input and the output; and
    the bistable system of claim 1 disposed adjacent the movable element, the movable element being moved between a first position and a second position in accordance with movement of the at least one beam between the first stable state and the second stable state.

26. The system of claim 25, wherein the system is one of an optical system, an electrical system and a fluidic system.

27. The system of claim 26, wherein the system is one of a data storage system and a switching system.

* * * * *

UNITED STATES PATENT AND TRADEMARK OFFICE
CERTIFICATE OF CORRECTION

PATENT NO. : 6,828,887 B2
DATED : December 7, 2004
INVENTOR(S) : Joel A. Kubby et al.

It is certified that error appears in the above-identified patent and that said Letters Patent is hereby corrected as shown below:

<u>Title page,</u>
Item [73], Assignee, please change "JPMorgan Chase Bank, Houston, TX (US)" to
-- Xerox Corporation, Stamford, CT (US) --.

Signed and Sealed this

Twenty-fifth Day of October, 2005

JON W. DUDAS
*Director of the United States Patent and Trademark Office*